United States Patent
Chen et al.

(10) Patent No.: US 9,111,882 B1
(45) Date of Patent: Aug. 18, 2015

(54) ORGANIC LIGHT EMITTING DEVICE AND FABRICATING METHOD THEREOF

(71) Applicant: Au Optronics Corporation, Hsinchu (TW)

(72) Inventors: Chih-Lei Chen, Taichung (TW); Sheng-Yang Huang, New Taipei (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 14/284,403

(22) Filed: May 22, 2014

(30) Foreign Application Priority Data

Feb. 19, 2014 (TW) .............................. 103105530 A

(51) Int. Cl.
  *H01L 27/32* (2006.01)
  *H01L 51/56* (2006.01)

(52) U.S. Cl.
  CPC .......... *H01L 27/322* (2013.01); *H01L 27/3213* (2013.01); *H01L 51/56* (2013.01)

(58) Field of Classification Search
  CPC .. H01L 27/3211; H01L 27/322; H01L 27/326
  See application file for complete search history.

(56) References Cited

U.S. PATENT DOCUMENTS

| 7,656,476 | B2 | 2/2010 | So | |
|---|---|---|---|---|
| 2011/0198629 | A1* | 8/2011 | Lee et al. | 257/89 |
| 2013/0082589 | A1* | 4/2013 | So et al. | 313/504 |

FOREIGN PATENT DOCUMENTS

| CN | 101055922 | 10/2007 |
|---|---|---|
| CN | 101819989 | 9/2010 |
| CN | 103050630 | 4/2013 |

* cited by examiner

*Primary Examiner* — John C Ingham
(74) *Attorney, Agent, or Firm* — Jianq Chyun IP Office

(57) ABSTRACT

A fabricating method of an organic light emitting device is provided. First to fourth lower pixel electrodes are respectively formed in first to fourth pixel regions of a substrate. By ink-jet printing processes, an interlayer is formed on the first to fourth lower pixel electrodes, and first to third color patterns are respectively formed on the interlayer in the first to third pixel regions. A fourth color layer is formed to cover the first to third color patterns and the interlayer in the fourth pixel region. Colors of the first to third color patterns and the fourth color layer are different. An upper pixel electrode is formed on the fourth color layer. A color filter arranging over the upper pixel electrode filters out a first color light, a second color light, light of third and fourth colors, and the fourth color light corresponding to the first to fourth pixel regions.

20 Claims, 8 Drawing Sheets

ORGANIC LIGHT EMITTING DEVICE AND FABRICATING METHOD THEREOF

CROSS-REFERENCE TO RELATED APPLICATION

This application claims the priority benefit of Taiwan application serial no. 103105530, filed on Feb. 19, 2014. The entirety of the above-mentioned patent application is hereby incorporated by reference herein and made a part of this specification.

BACKGROUND OF THE INVENTION

1. Field of the Invention

The invention relates to a light emitting device and a fabricating method thereof, and particularly relates to an organic light emitting device and a fabricating method thereof.

2. Description of Related Art

Due to the advantages like self-luminescence, no viewing-angle dependence, low power consumption, simple fabrication, low costs, low working temperature, high response speed, and full-color display, organic light emitting devices (OLED) have a great potential of application and are likely to become the mainstream of the illuminating light source of flat display panels in the next generation.

The full color technology commonly applied in the OLED display panels includes the technology of side-by-side arrangement of red, green, and blue (RGB) pixels and the technology of white light OLED as a light source in combination with color filter layer. The technology of side-by-side arrangement of the RGB pixels provides light formed of light respectively emitted from the red, blue, and green pixels. With the technology, a preferable degree of color saturation and lower power consumption are achieved. However, the technology suffers from being difficult to obtain a broader color gamut and being difficult to align a mask. The technology of white light OLED as a light source in combination with color filter layer uses a color filter to filter out the three prime colors, which are colors of red, blue, and green. Although the technology does not require a mask for precise alignment, it suffers from a relatively less preferable color performance, higher power consumption, and being unable to respectively adjust preferred thicknesses of the red, blue, and green pixels. Thus, a full color technology having a preferable light emitting efficiency is needed in this field.

SUMMARY OF THE INVENTION

The invention provides a fabricating method of an organic light emitting device. The organic light emitting device fabricated accordingly has a preferable light emitting efficiency.

The invention also provides an organic light emitting device that has a preferable light emitting efficiency.

The fabricating method of the organic light emitting device of the invention includes the following steps. A substrate having a first pixel region, a second pixel region, a third pixel region, and a fourth pixel region is provided. A first lower pixel electrode, a second lower pixel electrode, a third lower pixel electrode, and a fourth lower pixel electrode are respectively formed in the first pixel region, the second pixel region, the third pixel region, and the fourth pixel region. A first interlayer is formed in the first pixel region, the second pixel region, the third pixel region, and the fourth pixel region by using a first ink-jet printing process. In addition, the first interlayer is respectively located on the first lower pixel electrode, the second lower pixel electrode, the third lower pixel electrode, and the fourth lower pixel electrode. A second ink-jet printing process is performed to form a first color pattern on the first interlayer in the first pixel region, a second color pattern on the first interlayer in the second pixel region, and a third color pattern on the first interlayer in the third pixel region. A fourth color layer is formed to cover the first color pattern, the second color pattern, and the third color pattern, and to cover the first interlayer in the fourth pixel region. In addition, colors of the first color pattern, the second color pattern, the third color pattern, and the fourth color layer are different from each other. An upper pixel electrode is formed on the fourth color layer. A color filter is arranged over the upper pixel electrode. In addition, the color filter has a first filter pattern, a second filter pattern, a third filter pattern, and a fourth filter pattern, the first filter pattern is disposed in correspondence with the first pixel region and filters light corresponding to the first color pattern out, the second filter pattern is disposed in correspondence with the second pixel region and filters light corresponding to the second color pattern out, the third filter pattern is disposed in correspondence with the third pixel region and filters light corresponding to the third color pattern and the fourth color layer out, and the fourth filter pattern is disposed in correspondence with the fourth pixel region and filters the light corresponding to the fourth color layer out.

The organic light emitting device of the invention includes a substrate, a first lower pixel electrode, a second lower pixel electrode, a third lower pixel electrode, a fourth lower pixel electrode, a first interlayer, a first color pattern, a second color pattern, a third color pattern, a fourth color layer, an upper pixel electrode, and a color filter. An isolation structure is disposed on the substrate to define a first pixel region, a second pixel region, a third pixel region, and a fourth pixel region separated from each other on the substrate. The first lower pixel electrode, the second lower pixel electrode, the third lower pixel electrode, and the fourth lower pixel electrode are respectively located in the first pixel region, the second pixel region, the third pixel region, and the fourth pixel region. The first interlayer is disposed in the first pixel region, the second pixel region, the third pixel region, and the fourth pixel region, and located on the first lower pixel electrode, the second lower pixel electrode, the third lower pixel electrode, and the fourth lower pixel electrode. The first color pattern, the second color pattern, and the third color pattern are respectively disposed on the first interlayer in the first pixel region, the first interlayer in the second pixel region, and the first interlayer in the third pixel region. The fourth color layer is disposed on the first color pattern, the second color pattern, the third color pattern, and the first interlayer in the fourth pixel region, and covers the isolation structure. The upper pixel electrode is located on the fourth color layer. The color filter is arranged over the upper pixel electrode. In addition, the color filter has the first filter pattern, the second filter pattern, the third filter pattern, and the fourth filter pattern, the first filter pattern is disposed in correspondence with the first pixel region and filters light corresponding to the first color pattern out, the second filter pattern is disposed in correspondence with the second pixel region and filters light corresponding to the second color pattern out, the third filter pattern is disposed in correspondence with the third pixel region and filters light corresponding to the third color pattern and the fourth color layer out, and the fourth filter pattern is disposed in correspondence with the fourth pixel region and filters the light corresponding to the fourth color layer out.

In an embodiment of the invention, a first color light is emitted corresponding to the first pixel region, a second color light is emitted corresponding to the second pixel region, a third color light is emitted corresponding to the third pixel region, and a fourth color light is emitted corresponding to the fourth pixel region.

In an embodiment of the invention, the first color light is red light, the second color light is green light, and the fourth color light is blue light.

In an embodiment of the invention, the first color pattern is a red pattern, the second color pattern is a green pattern, the third color pattern is a yellow pattern, and the fourth color layer is a blue layer.

In an embodiment of the invention, the first color pattern includes a first color material, the second color pattern includes a second color material, and the third color pattern includes the first color material and the second color material.

In an embodiment of the invention, an isolation structure is disposed on the substrate to define the first pixel region, the second pixel region, the third pixel region, and the fourth pixel region separated from each other. In addition, the fourth color layer is formed on the isolation structure.

In an embodiment of the invention, the methods of forming the fourth color layer and the upper pixel electrode are evaporation.

In an embodiment of the invention, the first interlayer includes at least one of a hole injection layer, a hole transport layer, and an electron blocking layer.

In an embodiment of the invention, a thickness of the first interlayer is between 10 nm to 100 nm.

In an embodiment of the invention, a second interlayer is further formed between the fourth color layer and the upper pixel electrode.

In an embodiment of the invention, a forming process of the second interlayer is evaporation.

In an embodiment of the invention, the second interlayer includes at least one of an electron injection layer, an electron transport layer, and a hole blocking layer.

In an embodiment of the invention, forming a charge generation layer located between the first, second, and third color patterns and the fourth color layer, and located between the first interlayer of the fourth pixel region and the fourth color layer is further included.

In an embodiment of the invention, the method of forming the charge generation layer comprises evaporation.

In an embodiment of the invention, a third interlayer is further formed, located between the charge generation layer and the first, second, and third color patterns, and located between the charge generation layer and the first interlayer on the fourth pixel region is further included.

In an embodiment of the invention, the third interlayer includes at least one of an electron injection layer, an electron transport layer, and a hole blocking layer.

In an embodiment of the invention, forming a fourth interlayer located between the charge generation layer and the fourth color layer is further included.

In an embodiment of the invention, the fourth interlayer includes at least one of a hole injection layer, a hole transport layer, and an electron blocking layer.

In an embodiment of the invention, upper surfaces of the first color pattern, the second color pattern, and the third color pattern are lower than an upper surface of the isolation structure.

In an embodiment of the invention, the color filter further includes a plurality of shielding patterns, located between the first filter pattern, the second filter pattern, the third filter pattern, and the fourth filter pattern.

Based on the above, in the fabricating method of the organic light emitting device of the invention, the ink-jet printing process is used to fabricate the first, second, and third color patterns in the first, second, and third pixel regions respectively, and then to form the fourth color layer on the fourth pixel region and each of the color patterns. By using with the color filter, the first, second, and fourth pixel regions of the organic light emitting device emit light of different colors, and the third pixel region emit white light. In addition, the light emitting efficiency of each of the colors may be optimized by respectively adjusting thicknesses of the color patterns and a thickness of the fourth color layer. Thus, the fabricating method of the organic light emitting device has a simplified fabricating process, and the organic light emitting device has a preferable light emitting efficiency and simple structure.

To make the above features and advantages of the invention more comprehensible, embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
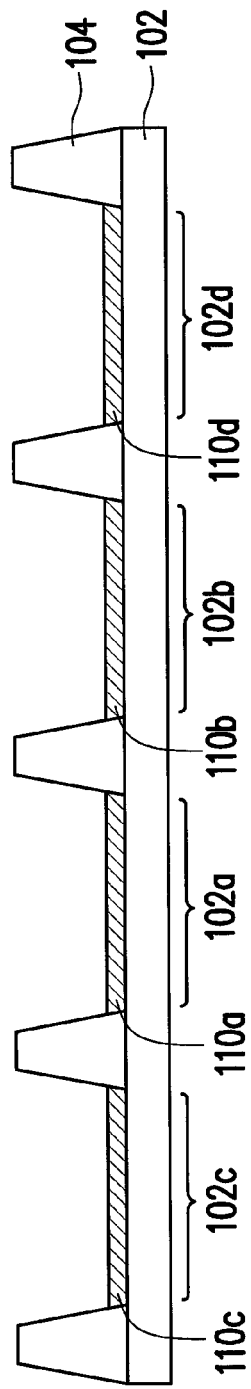
FIGS. 1A to 1E are cross-sectional views illustrating a fabricating method of an organic light emitting device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1E are cross-sectional views illustrating a fabricating method of an organic light emitting device according to an embodiment of the invention. Referring to FIG. 1A, a substrate 102 is firstly provided. The substrate 102 has a first pixel region 102a, a second pixel region 102b, a third pixel region 102c, and a fourth pixel region 102d. In this embodiment, the substrate 102 is disposed with an isolation structure 104, for example, to define the first pixel region 102a, the second pixel region 102b, the third pixel region 102c, and the fourth pixel region 102d that are separated from each other and arranged in the same column. Namely, as shown in FIG. 1A, the first pixel region 102a, the second pixel region 102b, the third pixel region 102c, and the fourth pixel region 102d are respectively accommodating spaces set by the isolation structure 104 and the substrate 102. In addition, the first pixel region 102a, the second pixel region 102b, the third pixel region 102c, and the fourth pixel region 102d are disposed in a side-by-side arrangement. In addition, the first pixel region 102a, the second pixel region 102b, and the fourth pixel region 102d are, for example, closely adjacent to each other. Also, the second pixel region 102b is located between the first pixel region 102a and the fourth pixel region 102d. A material of the substrate 102 may be glass, quartz, organic polymer, plastics, flexible plastics, or an opaque/reflective material, etc. The invention is not limited thereto. A material of the isolation structure 104 may be an insulating material such as silicon nitride, silicon oxide, silicon oxynitride, or an organic polymer, etc.

Then, a first lower pixel electrode 110a, a second lower pixel electrode 110b, a third lower pixel electrode 110c, and a fourth lower pixel electrode 110d are respectively formed in the first pixel region 102a, the second pixel region 102b, the third pixel region 102c, and the fourth pixel region 102d. The first lower pixel electrode 110a, the second lower pixel electrode 110b, the third lower pixel electrode 110c, and the fourth lower pixel electrode 110d are formed by using sputtering, deposition, or other known processes, for example. A material of the first lower pixel electrode 110a, the second lower pixel electrode 110b, the third lower pixel electrode 110c, and the fourth lower pixel electrode 110d may be a transparent conductive material or an opaque conductive material. In addition, each of the electrodes may have a single-layer structure or a multi-layer structure. The transparent conductive material includes metal oxides, such as indium tin oxide, indium zinc oxide, aluminum tin oxide, aluminum zinc oxide, indium germanium zinc oxide or other suitable oxides (such as zinc oxide), or a stack layer including at least two of the above. The opaque conductive material includes metals, such as silver, aluminum, molybdenum, copper, or titanium, or other suitable metals.

Figure 1B:
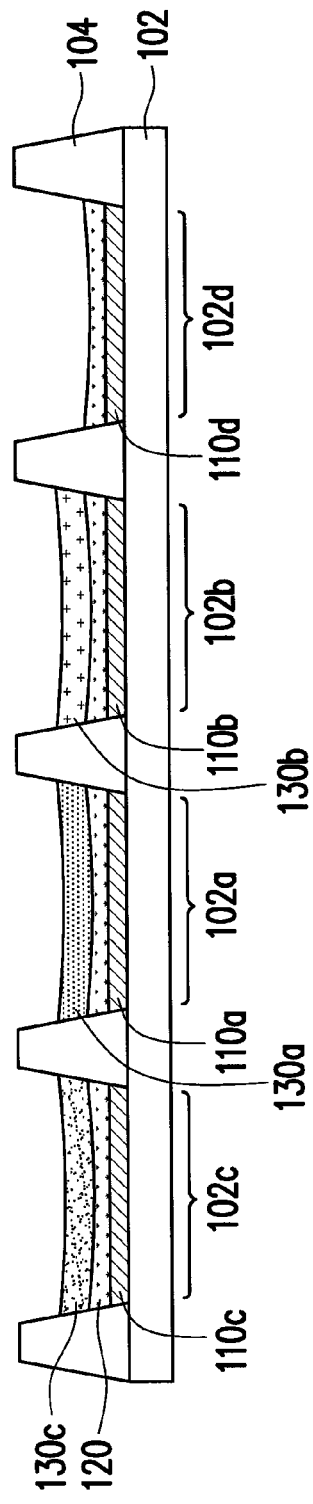

Referring to FIG. 1B, a first ink jet printing process is then performed to form a first interlayer 120 in the first pixel region 102a, the second pixel region 102b, the third pixel region 102c, and the fourth pixel region 102d, respectively. The first interlayer 120 is located on the first lower pixel electrode 110a, the second lower pixel electrode 110b, the third lower pixel electrode 110c, and the fourth lower pixel electrode 110d. Namely, the first interlayer 120 is located in the accommodating spaces of the first pixel region 102a, the second pixel region 102b, the third pixel region 102c, and the fourth pixel region 102d. The first interlayer 120 includes at least one of a hole injection layer (HIL), a hole transport layer (HTL), and an electron blocking layer (EBL), for example. In this embodiment, the first interlayer 120 includes a hole injection layer and a hole transport layer sequentially stacked on the substrate 102, for example. A thickness of the first interlayer 120 is between 10 nm to 100 nm, for example.

Then, a second ink jet printing process is performed to form a first color pattern 130a on the first interlayer 120 in the first pixel region 102a, a second color pattern 130b on the first interlayer 120 in the second pixel region 102b, and a third color pattern 130c on the first interlayer 120 in the third pixel region 102c. In this embodiment, the first color pattern 130a is a red pattern, for example, the second color pattern 130b is a green pattern, for example, and the third color pattern 130c is a yellow pattern, for example. In addition, the first color pattern 130a includes a first color material, for example, the second color pattern 130b includes a second color material, and the third color pattern 130c includes the first color material and the second color material. For example, the first color pattern 130a includes a red material, for example, the second color pattern 130b includes a green material, for example, and the third color pattern 130c includes 0.1%-1% of the red material and 99.9% to 99% of the green material, for example. Thus, the third color pattern 130c is in a color of yellow. Naturally, the third color pattern 130c may be formed of a single-color material, such as a yellow material. It should be especially noted that in this step, there is no ink-jet printing process performed to the first interlayer 120 of the fourth pixel region 102d. Thus, the first interlayer 120 of the fourth pixel region 102d does not have a color pattern.

It should also be mentioned that since the ink jet printing process is used to form the first interlayer 120 and the first color pattern 130a, the second color pattern 130b, and the third color pattern 130c, a fine metal mask is not required in the steps. Thus, a step of mask alignment is not required, and the fabricating process is significantly simplified.

Figure 1C:
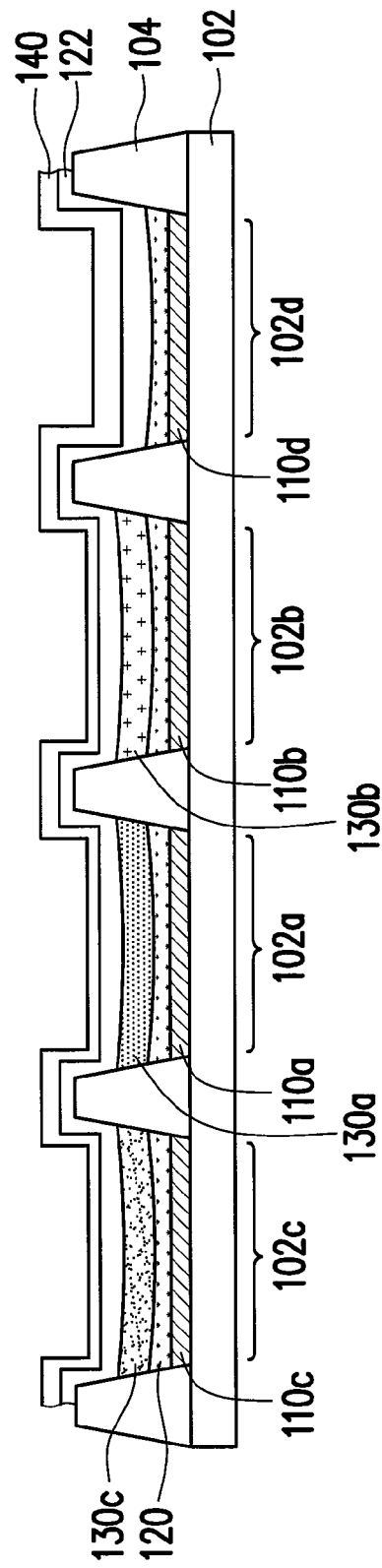

Referring to FIG. 1C, a fourth color layer 140 is then formed to cover the first color pattern 130a, the second color pattern 130b, and the third color pattern 130c, and cover the first interlayer 120 in the fourth pixel region 102d. In addition, colors of the first color pattern 130a, the second color pattern 130b, the third color pattern 130c, and the fourth color layer 140 are different from each other. The fourth color layer 140 is continuously formed on the first color pattern 130a, the second color pattern 130b, the third color pattern 130c, and the first interlayer 120 of the fourth pixel region 102d, for example. Thus, the fourth color layer 140 covers the isolation structure 104 between the first pixel region 102a, the second pixel region 102b, the third pixel region 102c, and the fourth pixel region 102d. In this embodiment, the fourth color layer 140 is a blue layer, for example. A method of forming the fourth color layer 140 is evaporation, for example.

In this embodiment, formation of a charge generation layer 122 is further included. The charge generation layer 122 is located between the first color pattern 130a, the second color pattern 130b, and the third color pattern 130c and the fourth color layer 140, and between the first interlayer 120 of the fourth pixel region 102d and the fourth color layer 140. A method of forming the charge generation layer 122 is evaporation, for example.

Figure 1D:
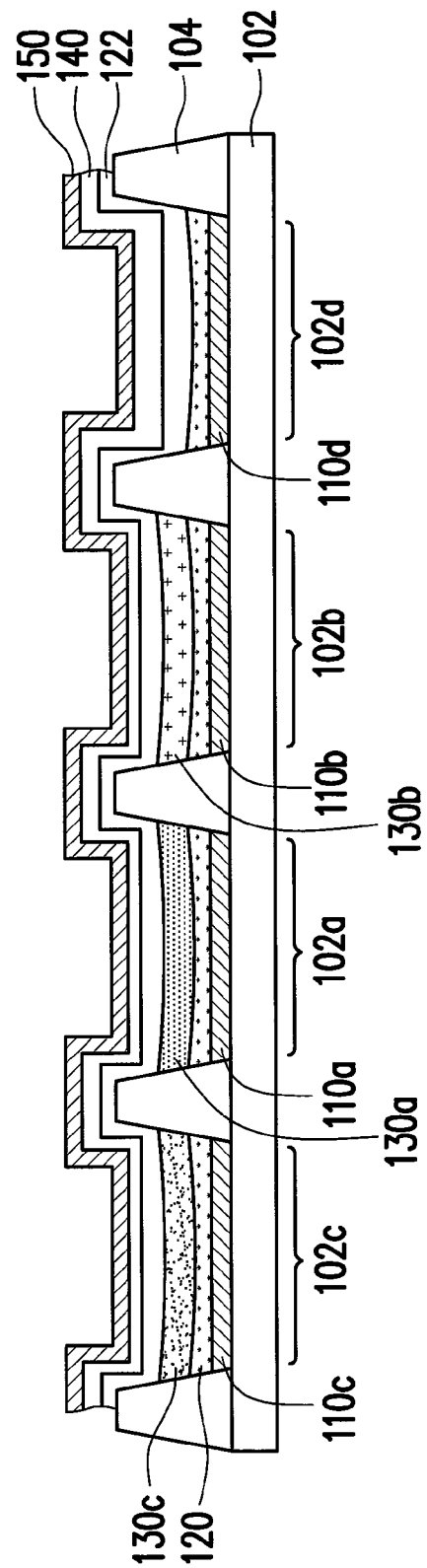

Referring to FIG. 1D, an upper pixel electrode 150 is formed on the fourth color layer 140. A method of forming the upper pixel electrode 150 is evaporation, for example, and a material of the upper pixel electrode 150 may be similar to the material of the lower pixel electrodes 110a, 110b, 110c, and 110d as described above or other suitable materials. Details in this respect will not be further reiterated hereinafter.

Figure 1E:
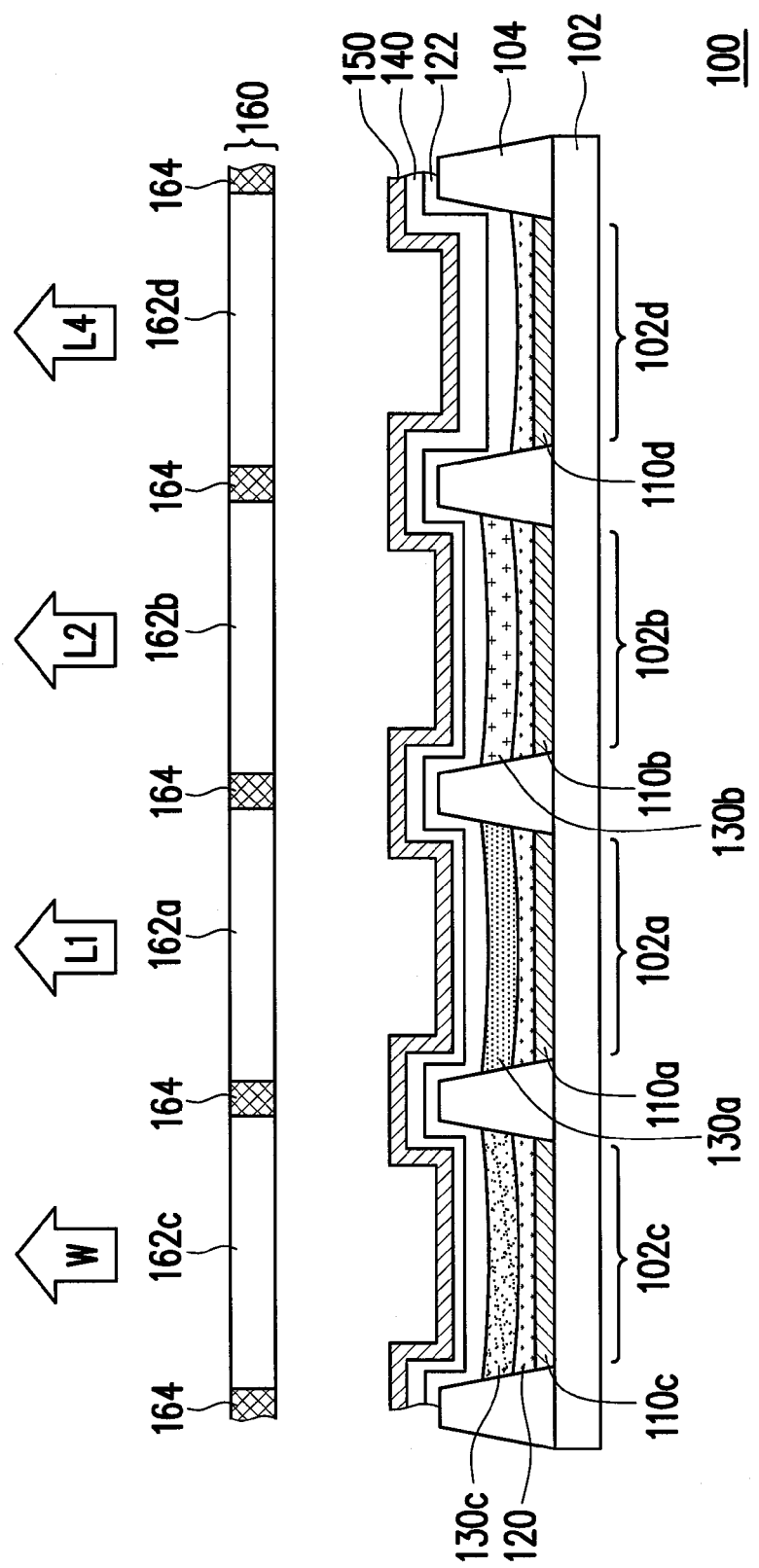

Referring to FIG. 1E, a color filter 160 is then arranged over the upper pixel electrode 150. The color filter 160 has a first filter pattern 162a, a second filter pattern 162b, a third filter pattern 162c, and a fourth filter pattern 162d. The color filter 160 may further include a shielding pattern 164, for example. The shielding pattern 164 is located between the first filter pattern 162a, the second filter pattern 162b, the third filter pattern 162c, and the fourth filter pattern 162d that are adjacent. The first filter pattern 162a is disposed in correspondence with the first pixel region 102a and filters light corresponding to the first color pattern 130a out, the second filter pattern 162b is disposed in correspondence with the second pixel region 102b and filters light corresponding to the second color pattern 130b out, the third filter pattern 162c is disposed in correspondence with the third pixel region 102c and filters light corresponding to the third color pattern 130c and the fourth color layer 140 out, the fourth filter pattern 162d is disposed in correspondence with the fourth pixel region 102d and filters light corresponding to the fourth color layer 140 out. The shielding pattern 164 is disposed in correspondence with the isolation structure 104, for example. In this embodiment, the first filter pattern 162a is a red filter pattern, for example, the second filter pattern 162b is a green filter pattern, for example, the third filter pattern 162c is a white filter pattern, for example, the fourth filter pattern 162d is a blue filter pattern, for example, and the shielding pattern 164 is a black resin pattern, for example.

In this embodiment, the organic light emitting device 100 includes the substrate 102, the first lower pixel electrode 110a, the second lower pixel electrode 110b, the third lower pixel electrode 110c, the fourth lower pixel electrode 110d, the first interlayer 120, the first color pattern 130a, the second color pattern 130b, the third color pattern 130c, the fourth color layer 140, the upper pixel electrode 150, and the color filter 160. The isolation structure 104 is disposed on the substrate 102 to define the first pixel region 120a, the second pixel region 102b, the third pixel region 102c, and the fourth pixel region 102d. The first pixel region 120a, the second pixel region 102b, the third pixel region 102c, and the fourth pixel region 102d on the substrate 102 are separated from each other. The first lower pixel electrode 110a, the second lower pixel electrode 110b, the third lower pixel electrode 110c, and the fourth lower pixel electrode 110d are respectively located in the first pixel region 102a, the second pixel region 102b, the third pixel region 102c, and the fourth pixel region 102d. The first interlayer 120 is disposed in the first pixel region 102a, the second pixel region 102b, the third pixel region 102c, and the fourth pixel region 102d, and located on the first lower pixel electrode 110a, the second lower pixel electrode 110b, the third lower pixel electrode 110c, and the fourth lower pixel electrode 110d. The first color pattern 130a, the second color pattern 130b, and the third color pattern 130c are respectively disposed on the first interlayer 120 in the first pixel region 102a, the first interlayer 120 in the second pixel region 102b, and the first interlayer 120 in the third pixel region 102c. In addition, upper surfaces of the first color pattern 130a, the second color pattern 130b, and the third color pattern 130c are lower than an upper surface of the isolation structure 104, for example. Namely, the first color pattern 130a, the second color pattern 130b, and the third color pattern 130c are located in the accommodating spaces defined by the isolation structure 104.

The fourth color layer 140 is disposed on the first color pattern 130a, the second color pattern 130b, and the third color pattern 130c and on the first interlayer 120 in the fourth pixel region 102d, and covers the isolation structure 104. Also, the colors of the first color pattern 130a, the second color pattern 130b, the third color pattern 130c, and the fourth color layer 140 are different from each other. Compared with the first color pattern 130a, the second color pattern 130b, and the third color pattern 130c being respectively located in the first pixel region 102a, the second pixel region 102b, and the third pixel region 102c, the fourth color layer 140 covers the first color pattern 130a, the second color pattern 130b, the third color pattern 130c, and the isolation structure 104.

The upper pixel electrode 150 is located on the fourth color layer 140. The color filter 160 is located on the upper pixel electrode 150. In addition, the color filter 160 has the first filter pattern 162a, the second filter pattern 162b, the third filter pattern 162c, and the fourth filter pattern 162d. The first filter pattern 162a is disposed in correspondence with the first pixel region 102a and filters the light corresponding to the first color pattern 130a out, the second filter pattern 162b is disposed in correspondence with the second pixel region 102b and filters the light corresponding to the second color pattern 130b out, the third filter pattern 162c is disposed in correspondence with the third pixel region 102c and filters the light corresponding to the third color pattern 130c and the fourth color layer 140 out, the fourth filter pattern 162d is disposed in correspondence with the fourth pixel region 102d and filters the light corresponding to the fourth color layer 140 out.

In this embodiment, when the organic light emitting device 100 is driven, light corresponding to the fourth color layer 140 in the first pixel region 102a is filtered off, and light from the first color pattern 130a is filtered out. Therefore, a first color light L1 such as red light is emitted corresponding to the first pixel region 102a. Light emitted corresponding to the fourth color layer 140 in the second pixel region 102b is filtered off, and light from the second color pattern 130b is filtered out. Therefore, a second color light L2 such as green light is emitted corresponding to the second pixel region 102b. Light emitted corresponding to the fourth color layer 140 in the fourth pixel region 102d is filtered out by the fourth color filter pattern 162d. Therefore, a fourth color light L4 such as blue light is emitted corresponding to the fourth pixel region 102d. Light emitted corresponding to the third color pattern 130c and the fourth color layer 140 in the third pixel region 102c is filtered out together by the third filter pattern 162c. Therefore, a white light W combined by the third color pattern 130c and the fourth color layer 140 is emitted corresponding to the third pixel region 102c, wherein the white light W is white light formed of the colors of red, blue, and green, for example.

Namely, the organic light emitting device 100 includes a first light emitting unit (not shown), a second light emitting unit (not shown), a third light emitting unit (not shown), and a fourth light emitting unit (not shown), which are respectively disposed in correspondence with the first pixel region 102a, the second pixel region 102b, the third pixel region 102c, and the fourth pixel region 102d. In addition, the first light emitting unit emits the first color light L1, the second light emitting unit emits the second color light L2, the fourth light emitting unit emits the fourth color light L4, and the third light emitting unit emits the white light W. Furthermore, the first color light L1, the second color light L2, and the fourth color light L4 are red light, green light, and blue light, for example.

Figure 2:
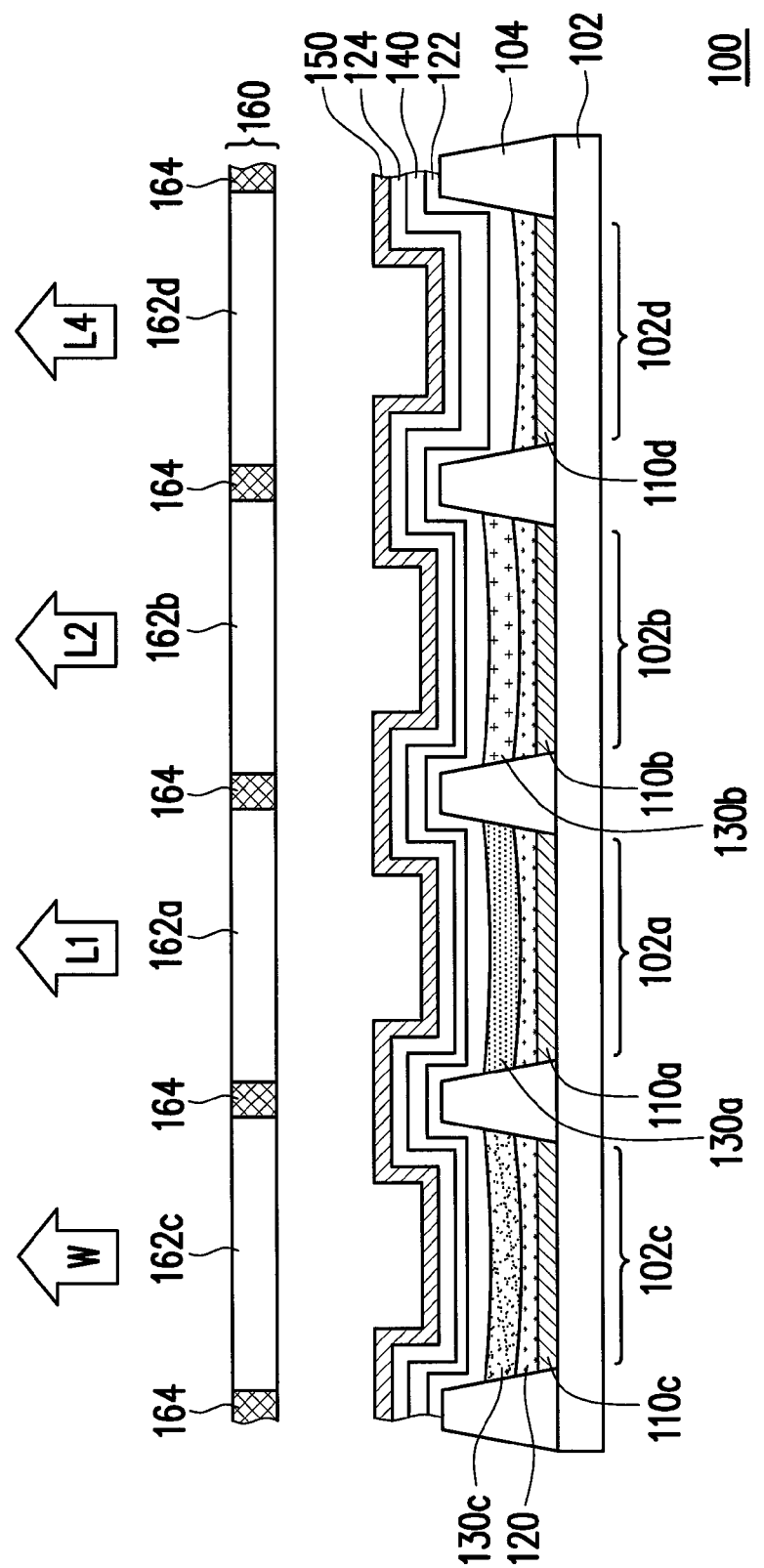
FIG. 2 is a cross-sectional view of an organic light emitting device according to an embodiment of the invention.
Figure 3:
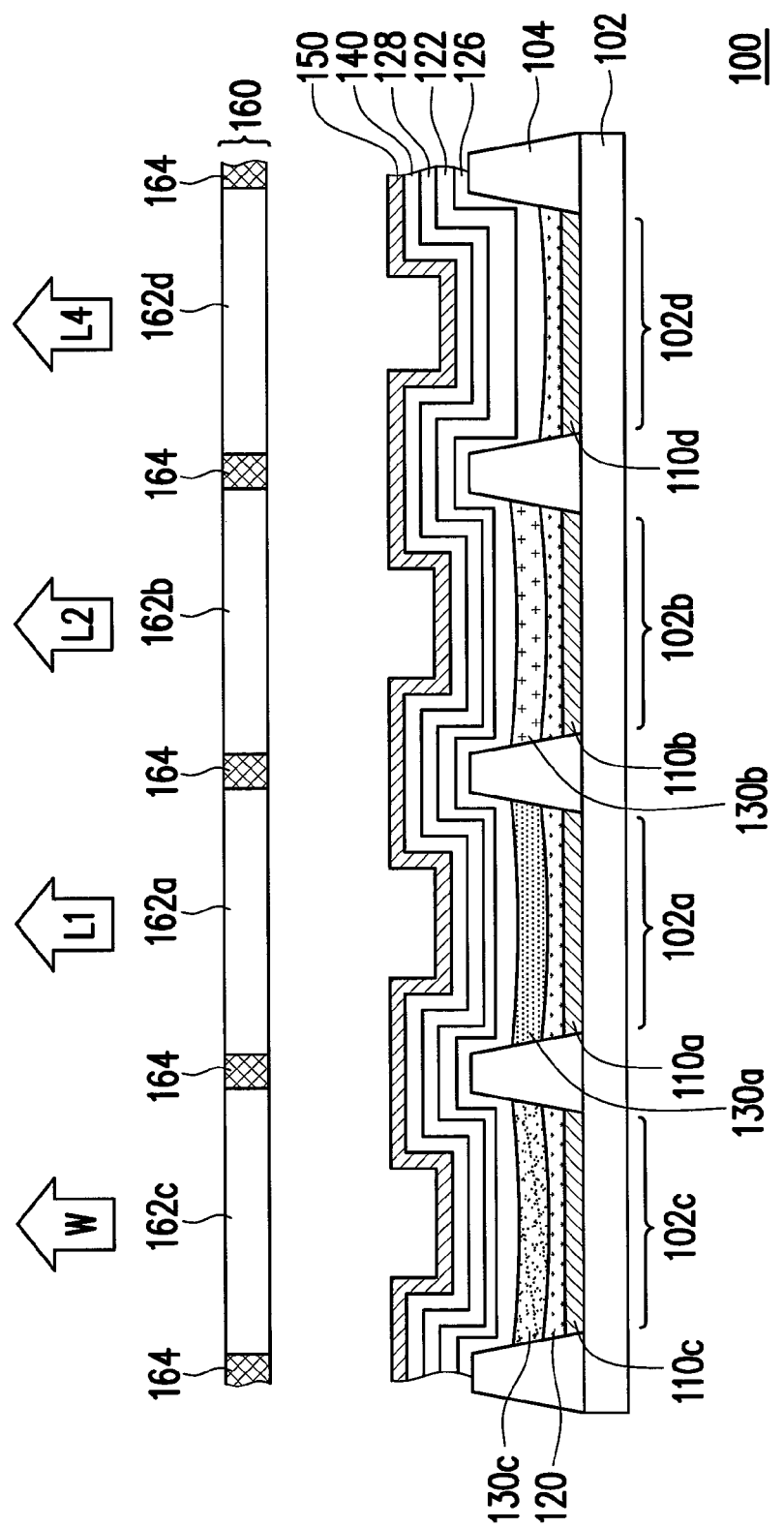
FIG. 3 is a cross-sectional view of an organic light emitting device according to an embodiment of the invention.

It should be mentioned that although in the embodiment, the organic light emitting device having a structure shown in FIG. 1E is fabricated based on the processes described above, the invention is not limited thereto. In other words, the organic light emitting device having the structure shown in FIG. 1E may be fabricated through other processes. Also, in other embodiments, an organic light emitting device may further include at least one additional interlayer. For example, as shown in FIG. 2, the organic light emitting device 100 in one embodiment may further include a second interlayer 124, for example, which is disposed between the fourth color layer 140 and the upper pixel electrode 150. A method of forming the second interlayer 124 is evaporation, for example. The second interlayer 124 may include at least one of an electron injection layer (EIL), an electron transport layer (ETL), and a hole blocking layer, for example. In this embodiment, the second interlayer 124 includes an electron transport layer and an electron injection layer disposed on the fourth color layer 140, for example. As shown in FIG. 3, in another embodiment, the organic light emitting device 100 further includes a third interlayer 126 and a fourth interlayer 128, for example. The third interlayer 126 is located between the charge generation layer 122 and the first color pattern 130a, the second color pattern 130b, and the third color pattern 130c and located between the charge generation layer 122 and the first interlayer 120 of the fourth pixel region 102d, for example. The third interlayer 126 may include at least one of an electron injection layer (EIL), an electron transport layer (ETL), and a hole blocking layer (HBL), for example. In this embodiment, the third interlayer 126 is a hole blocking layer (HBL), for example. The fourth interlayer 128 is located between the charge generation layer 122 and the fourth color layer 140, for example. The fourth interlayer 128 includes at least one of a hole injection layer (HIL), a hole transport layer (HTL), and an electron blocking layer (EBL), for example. In this embodiment, the fourth interlayer 128 includes a hole injection layer and a hole transport layer sequentially stacked on the charge generation layer 122, for example. However, based on the needs, people skilled in the art may omit or add a charge generation layer or an interlayer. The invention is not limited thereto. In addition, since the fourth color layer 140, the charge generation layer 122, the second interlayer 124, the third interlayer 126, and the fourth interlayer 128 are films fully formed on the substrate 102, the same method, such as evaporation, may be used to form the films, so as to simplified the fabricating process.

In the organic light emitting device 100 of the above-described embodiments, the first pixel region 102a, the second pixel region 102b, the third pixel region 102c, and the fourth pixel region 102d are disposed in a side-by-side arrangement. In addition, the light emitting positions corresponding to the first pixel region 102a, the second pixel region 102b, and the fourth pixel region 102d respectively emit the first color light L1, the second color light L2, and the fourth color light L4, whereas the light emitting position corresponding to the third pixel region 102c emits the white light W. In this embodiment, the first color light L1, the second color light L2, and the fourth color light L4 are red light, green light, and blue light, for example. Thus, the organic light emitting device 100 has advantages of the RBG side-by-side (RGB SBS) technology and the technology of white light OLED as a light source in combination with color filter layer (WOLED+CF), i.e. a lower power consumption, a longer life span of blue light, and a simpler structure. In addition, based on the needs, thicknesses of the first color pattern 130a, the second color pattern 130b, and the third color pattern 130c and a thickness of the fourth color layer 140 may be adjusted respectively, or thicknesses of the charge generation layer 122 and the interlayers 124, 126, and 128 may be respectively adjusted, so as to optimize light emitting efficiency of each color to obtain a preferable color saturation, such that the organic light emitting device 100 is allowed to achieve the most preferable light emitting efficiency. In addition, compared with the conventional hybrid common blue structure, the organic light emitting device 100 does not have the blue peak issue.

In the fabricating process of the organic light emitting device 100, the ink jet printing process is used to form the first, second, and third color patterns 130a, 130b, and 130c in the first to third pixel regions 102a, 102b, and 102c. Also, the ink-jet printing process is used to form the first interlayer 120 in the first to fourth pixel regions 102a, 102b, 102c, and 102d. Therefore, a mask that requires precise alignment needs not to be used, and the fabricating process is consequently simplified. In addition, since films such as the fourth color layer 140, the charge generation layer 122, and the second to fourth interlayers 124, 126, and 128 are all films fully formed on the substrate 102, the same method, such as evaporation, may be used to form the films, so as to simplified the fabricating process. Thus, the organic light emitting device 100 has a higher light emitting efficiency and lower fabricating cost, thus meeting the requirement of full color technology.

An experiment described below serves to prove an efficiency of the white light emitted by the organic light emitting device of the invention.

Figure 4:
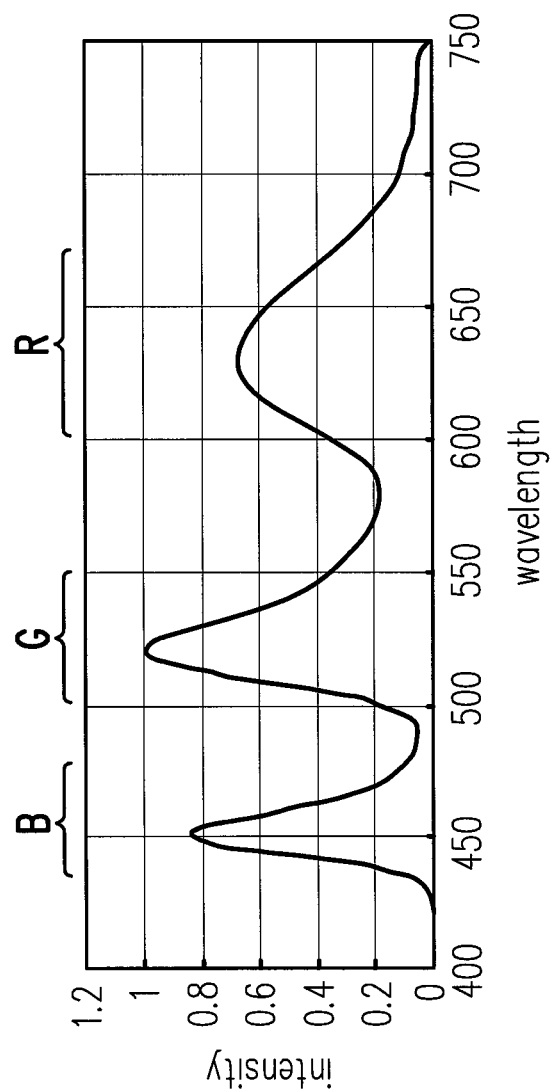
FIG. 4 is a frequency spectrum showing a relationship between wavelength and intensity of white light emitted from a third pixel region of an organic light emitting device in the experimental example.
Figure 5:
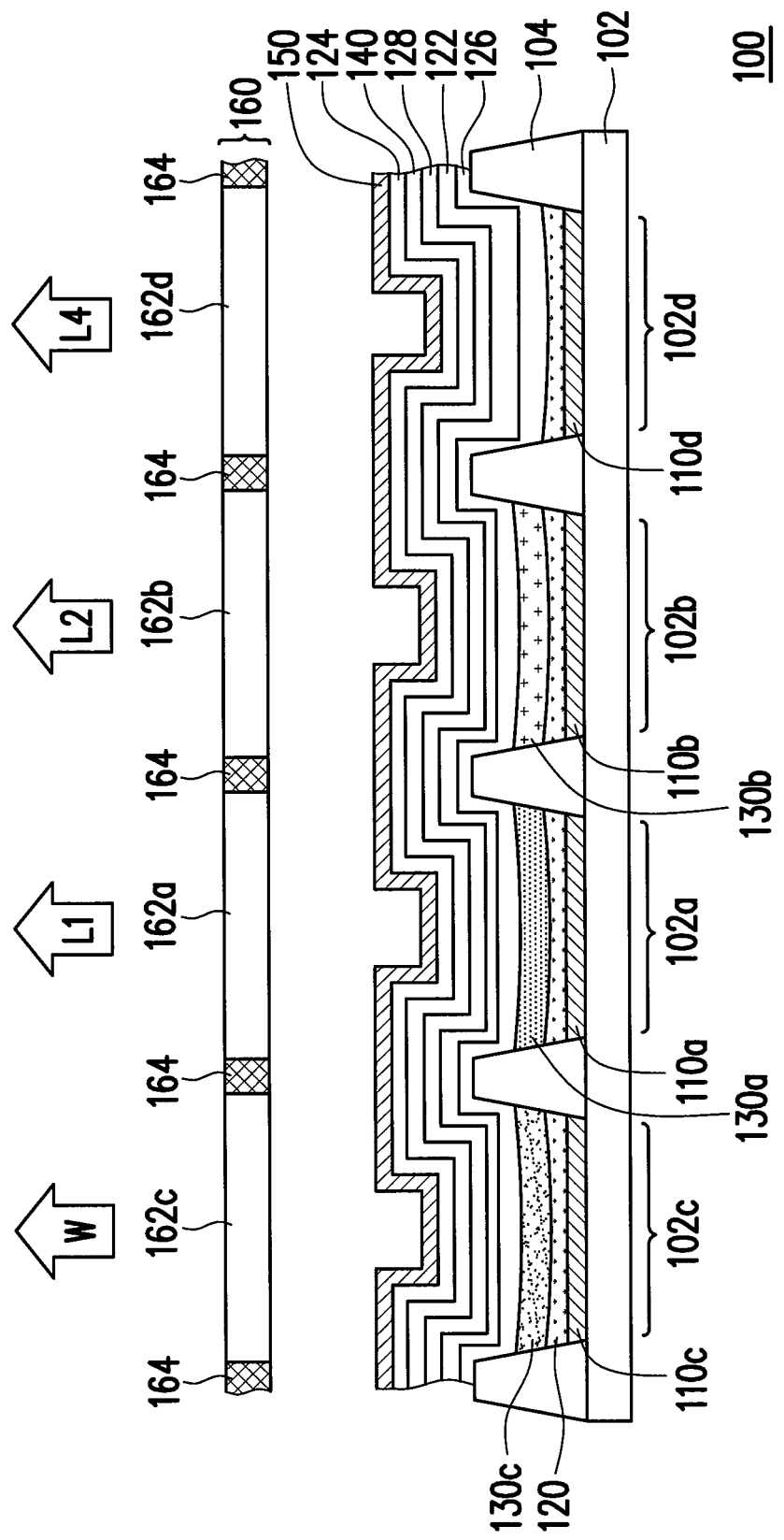
FIG. 5 is a cross-sectional view of the organic light emitting device of the experimental example.

FIG. 4 is a frequency spectrum showing a relationship between wavelength and intensity of white light emitted from a third pixel region of an organic light emitting device in the experimental example. The organic light emitting device of the experimental example, whose structure is shown in FIG. 5, includes an anode (i.e. the third lower pixel electrode 110c), a hole injection layer and a hole transport layer (i.e. the first interlayer 120), pattern units formed of red and green (i.e. the third color pattern 130c), a hole blocking layer (i.e. the third interlayer 126), a charge generation layer (i.e. the charge generation layer 122), a hole injection layer and a hole transport layer (i.e. the fourth interlayer 128), a blue layer (i.e. the fourth color layer 140), an electron transport layer and an electron injection layer (i.e. the second interlayer 124), a cathode layer (i.e. the upper pixel electrode 150), and a color filter (i.e. the color filter 160) stacked sequentially on a substrate. In addition, a content of a red material and a content of a green material in the pattern unit formed of red and green are respectively 0.5% and 99.5%.

Referring to FIG. 4, a white light beam of the organic light emitting device of the experimental example includes positions of wave peaks that respectively correspond to wavelengths of red light (R), green light (G), and blue light (B), indicating that the white light beam is formed of the red light, green light, and blue light and has a preferable light emitting efficiency.

In addition, by further measuring a CIE chromaticity coordinate (x, y) of the white light beam of the organic light emitting device of the experimental example, a value of (0.34, 0.37) is obtained. Thus, the white light beam of the organic light emitting device of the experimental example meets the standard of white light.

In view of the experimental example, it can be known that the third color pattern and the fourth color layer of the organic light emitting device of the invention are capable of generating a light source of white light that meets the requirement together.

In view of the above, in the fabricating method of the organic light emitting device of the invention, the ink-jet printing process is used to fabricate the first, second, and third color patterns in the first, second, and third pixel regions respectively, and then to form the fourth color layer on the fourth pixel region and each of the color patterns. By using with the color filter, the light emitting positions corresponding to the first, second, and fourth pixel regions emit red light, green light, and blue light respectively, for example. In addition, the light emitting position corresponding to the third pixel region emits white light formed of red light, green light, and blue light, for example. Since the light emitting units that emit single-color light are in a side-by-side arrangement, and white light is formed by combining plural kinds of single-color light that are emitted, the organic light emitting device has a lower power consumption, longer lift span of blue light, and a simpler structure.

In the fabricating process of the organic light emitting device, the thicknesses of the color patterns and the fourth color layer or the thicknesses of the interlayers may be adjusted based on each color light, so that the organic light emitting device is allowed to achieve the most preferable light emitting efficiency. Besides, since it is not necessary to use a mask that requires precise alignment in the fabricating process of the organic light emitting device, and the same fabricating process may be used to fabricate plural kinds of films, the fabricating process is thus simplified. Thus, the organic light emitting device has a higher light emitting efficiency and lower fabricating cost, thus meeting the requirement of full color technology.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabricating method of an organic light emitting device, comprising:
   providing a substrate having a first pixel region, a second pixel region, a third pixel region, and a fourth pixel region;
   forming a first lower pixel electrode, a second lower pixel electrode, a third lower pixel electrode, and a fourth lower pixel electrode respectively in the first pixel region, the second pixel region, the third pixel region, and the fourth pixel region;
   forming a first interlayer in the first pixel region, the second pixel region, the third pixel region, and the fourth pixel region by using a first ink-jet printing process, wherein the first interlayer is respectively located on the first lower pixel electrode, the second lower pixel electrode, the third lower pixel electrode, and the fourth lower pixel electrode;
   performing a second ink-jet printing process to form a first color pattern on the first interlayer in the first pixel region, a second color pattern on the first interlayer in the second pixel region, and a third color pattern on the first interlayer in the third pixel region;
   forming a fourth color layer to cover the first color pattern, the second color pattern, and the third color pattern, and cover the first interlayer in the fourth pixel region, wherein colors of the first color pattern, the second color pattern, the third color pattern, and the fourth color layer are different from each other;
   forming an upper pixel electrode on the fourth color layer; and
   arranging a color filter over the upper pixel electrode, wherein the color filter has a first filter pattern, a second filter pattern, a third filter pattern and a fourth filter pattern, the first filter pattern is disposed in correspondence with the first pixel region and filters light corresponding to the first color pattern out, the second filter pattern is disposed in correspondence with the second pixel region and filters light corresponding to the second color pattern out, the third filter pattern is disposed in correspondence with the third pixel region and filters light corresponding to the third color pattern and the fourth color layer out, and the fourth filter pattern is disposed in correspondence with the fourth pixel region and filters the light corresponding to the fourth color layer out.

2. The fabricating method of the organic light emitting device as claimed in claim 1, wherein a first color light is emitted corresponding to the first pixel region, a second color light is emitted corresponding to the second pixel region, a third color light is emitted corresponding to the third pixel region, and a fourth color light is emitted corresponding to the fourth pixel region.

3. The fabricating method of the organic light emitting device as claimed in claim 1, wherein the first color pattern is a red pattern, the second color pattern is a green pattern, the third color pattern is a yellow pattern, and the fourth color layer is a blue layer.

4. The fabricating method of the organic light emitting device as claimed in claim 1, wherein the first color pattern comprises a first color material, the second color pattern comprises a second color material, and the third color pattern comprises the first color material and the second color material.

5. The fabricating method of the organic light emitting device as claimed in claim 1, wherein an isolation structure is disposed on the substrate to define the first pixel region, the second pixel region, the third pixel region, and the fourth pixel region separated from each other on the substrate, and the fourth color layer is formed on the isolation structure.

6. The fabricating method of the organic light emitting device as claimed in claim 1, wherein the methods of forming the fourth color layer and the upper pixel electrode are evaporation.

7. The fabricating method of the organic light emitting device as claimed in claim 1, wherein the first interlayer comprises at least one of a hole injection layer, a hole transport layer, and an electron blocking layer.

8. The fabricating method of the organic light emitting device as claimed in claim 1, further comprising forming a second interlayer between the fourth color layer and the upper pixel electrode, wherein the second interlayer comprises at least one of an electron injection layer, an electron transport layer, and a hole blocking layer.

9. The fabricating method of the organic light emitting device as claimed in claim 1, further comprising forming a charge generation layer located between the first, second, and third color patterns and the fourth color layer, and located between the first interlayer of the fourth pixel region and the fourth color layer.

10. The fabricating method of the organic light emitting device as claimed in claim 9, further comprising a third interlayer located between the charge generation layer and the first, second, and third color patterns, and located between the charge generation layer and the first interlayer in the fourth pixel region, wherein the third interlayer comprises at least one of an electron injection layer, an electron transport layer, and a hole blocking layer.

11. The fabricating method of the organic light emitting device as claimed in claim 9, further comprising forming a fourth interlayer located between the charge generation layer and the fourth color layer, wherein the fourth interlayer comprises at least one of a hole injection layer, a hole transport layer, and an electron blocking layer.

12. An organic light emitting device, comprising:
   a substrate, wherein an isolation structure is disposed on the substrate to define a first pixel region, a second pixel region, a third pixel region, and a fourth pixel region separated from each other on the substrate;
   a first lower pixel electrode, a second lower pixel electrode, a third lower pixel electrode, and a fourth lower pixel electrode, respectively located in the first pixel region, the second pixel region, the third pixel region, and the fourth pixel region;
   a first interlayer, disposed in the first pixel region, the second pixel region, the third pixel region and the fourth pixel region, and located on the first lower pixel electrode, the second lower pixel electrode, the third lower pixel electrode and the fourth lower pixel electrode;
   a first color pattern, a second color pattern, and a third color pattern, respectively disposed on the first interlayer in the first pixel region, the first interlayer in the second pixel region, and the first interlayer in the third pixel region;
   a fourth color layer, disposed on the first color pattern, the second color pattern, the third color pattern and the first interlayer in the fourth pixel region, and covering the isolation structure, wherein colors of the first color pattern, the second color pattern, the third color pattern, and the fourth color layer are different from each other;

an upper pixel electrode, located on the fourth color layer; and a color filter, arranged over the upper pixel electrode, wherein the color filter has a first filter pattern, a second filter pattern, a third filter pattern, and a fourth filter pattern, the first filter pattern is disposed in correspondence with the first pixel region and filters light corresponding to the first color pattern out, the second filter pattern is disposed in correspondence with the second pixel region and filters light corresponding to the second color pattern out, the third filter pattern is disposed in correspondence with the third pixel region and filters light corresponding to the third color pattern and the fourth color layer out, and the fourth filter pattern is disposed in correspondence with the fourth pixel region and filters the light corresponding to the fourth color layer out.

13. The organic light emitting device as claimed in claim 12, wherein a light emitting position corresponding to the first pixel region emits a first color light, a light emitting position corresponding to the second pixel region emits a second color light, a light emitting position corresponding to the third pixel region emits a white light, and a light emitting position corresponding to the fourth pixel region emits a fourth color light.

14. The organic light emitting device as claimed in claim 12, wherein the first color pattern is a red pattern, the second color pattern is a green pattern, the third color pattern is a yellow pattern, and the fourth color layer is a blue layer.

15. The organic light emitting device as claimed in claim 12, wherein upper surfaces of the first color pattern, the second color pattern, and the third color pattern are lower than an upper surface of the isolation structure.

16. The organic light emitting device as claimed in claim 12, further comprising a second interlayer located between the fourth color layer and the upper pixel electrode.

17. The organic light emitting device as claimed in claim 12, further comprising a charge generation layer, located between the first, second, and third color patterns and the fourth color layer, and located between the first interlayer in the fourth pixel region and the fourth color layer, and covering the isolation structure.

18. The organic light emitting device as claimed in claim 17, further comprising a third interlayer, located between the charge generation layer and the first color pattern, the second color pattern, and the third color pattern, and located between the charge generation layer and the first interlayer in the fourth pixel region, and covering the isolation structure.

19. The organic light emitting device as claimed in claim 17, further comprising a fourth interlayer, located between the charge generation layer and the fourth color layer, and covering the isolation structure.

20. The organic light emitting device as claimed in claim 12, wherein the color filter further comprises a plurality of shielding patterns, located between the first filter pattern, the second filter pattern, the third filter pattern, and the fourth filter pattern.

* * * * *